United States Patent [19]

Tihanyi et al.

[11] Patent Number: 4,937,646
[45] Date of Patent: Jun. 26, 1990

[54] MOSFET WITH TEMPERATURE PROTECTION

[75] Inventors: Jenoe Tihanyi; Johann Bierlmaier, both of Munich, Fed. Rep. of Germany

[73] Assignee: Siemens Aktiengesellschaft, Berlin and Munich, Fed. Rep. of Germany

[21] Appl. No.: 191,719

[22] Filed: May 2, 1988

Related U.S. Application Data

[63] Continuation of Ser. No. 881,164, Jul. 2, 1986, abandoned.

[30] Foreign Application Priority Data

Jul. 9, 1985 [DE]  Fed. Rep. of Germany ....... 3524517

[51] Int. Cl.$^5$ ..................... H01L 29/74; H01L 27/02
[52] U.S. Cl. ........................ 357/43; 357/28; 357/38; 307/310
[58] Field of Search ............... 357/43, 28, 38, 234; 307/310

[56] References Cited

U.S. PATENT DOCUMENTS

| 3,872,418 | 3/1975 | Plough et al. | 357/28 |
| 4,050,083 | 9/1977 | Jaskolski et al. | 357/28 |
| 4,117,505 | 9/1978 | Nakata | 357/28 |
| 4,142,115 | 2/1979 | Nakata et al. | 357/38 |
| 4,323,793 | 4/1982 | Schutten et al. | 307/310 |

FOREIGN PATENT DOCUMENTS

| 2245089 | 4/1975 | France . | |
| 52-109881 | 9/1977 | Japan . | |
| 59-202658 | 11/1984 | Japan . | |
| 60-148161 | 8/1985 | Japan | 357/23.13 |
| 2103877 | 2/1983 | United Kingdom | 357/23.13 |

OTHER PUBLICATIONS

H. Wolf, "Semiconductors," ©1971, John Wiley & Sons, Inc., p. 399.

Primary Examiner—Joseph E. Clawson, Jr.
Attorney, Agent, or Firm—John Francis Moran

[57] ABSTRACT

On the semiconductor body of a MOSFET (1), the semiconductor body of a thyristor (5) (or of a bipolar transistor) is located for thermal conduction purposes. The anode and cathode terminals (A, K) (emitter and collector terminal) are connected to the gate terminal (G) and to the source terminal (S) of the MOSFET (1), respectively. The thyristor (bipolar transistor) is rated so that it turns on before a temperature of 150° to 180° is obtained which is critical for the MOSFET. Thus the gate-source capacitance of the MOSFET is effectively shortcircuited and the MOSFET turns off.

7 Claims, 1 Drawing Sheet

MOSFET WITH TEMPERATURE PROTECTION

BACKGROUND OF THE INVENTION

This invention relates to a semiconductor component including a MOSFET, and it relates, more particularly, to such a component having a semiconductor body with two main surfaces as well as a gate electrode and a source electrode.

Semiconductor components only function well up to certain temperatures. If the junction temperatures exceed values which range between 130° and 180° C. depending on the design of the particular semiconductor component, they lose their blocking ability or ability to withstand reverse bias potentials in the off-state. The flow of current through the semiconductor component may then become so great that the component is destroyed. High external or ambient temperatures may lead to making the semiconductor component unable to assume and maintain its off-state even at current values below its nominal current. These problems arise with all semiconductor components containing a pn junction, which includes bipolar semiconductor components as well as IGFET structures.

SUMMARY OF THE INVENTION

It is an object of the invention to provide such a MOSFET so that it is reliably protected against high temperatures.

This problem is overcome by a semiconductor device having the following features:
(a) On one of the main surfaces of the semiconductor body of the MOSFET, the semiconductor body of a semiconductor switch is fastened, which turns on when a certain junction temperature is reached;
(b) the two semiconductor bodies are connected together thermally;
(c) the semiconductor body of the semiconductor switch has two main electrodes;
(d) the main electrodes are connected to the gate electrode and to the source electrode, respectively.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
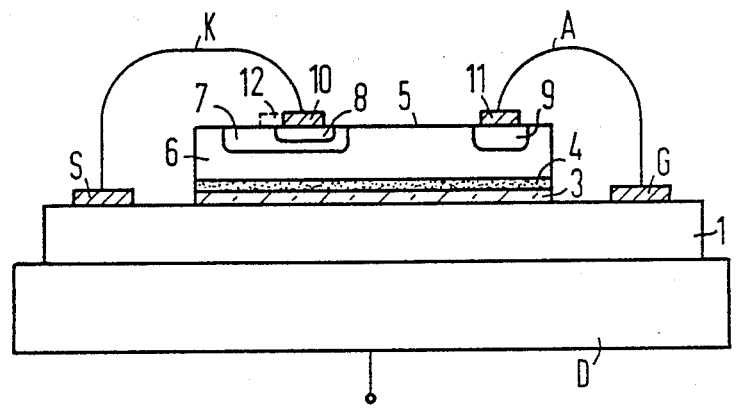
FIG. 1 illustrates a sectional view of one illustrative embodiment of the invention.

In FIG. 1, the semiconductor component comprises a MOSFET, having a semiconductor body 1 illustrated in rather simplified form. One of the major surfaces of the semiconductor body 1 is connected to a drain electrode D. On the other major surface, a source electrode S and a gate electrode G are mounted. On this same main surface which includes the source and gate electrodes, a semiconductor switch is also mounted. The mounted semiconductor switch is identified with 5. In the simplest case this semiconductor switch may be, as shown, a lateral thyristor. It consists of a central region 6, wherein are located in the planar surface an anode-side emitter zone 9 and a cathode-side base zone 7. In zone 7, a cathode-side emitter zone 8 is embedded into the planar surface. Zones 8 and 9 are respectively provided with electrodes 10, 11 which serves as the cathode terminal K and the anode terminal A, respectively. The electrodes 10 and 11 are respective electrically connected to the source electrode S and to the gate electrode G.

It is desirable for the thyristor to be electrically insulated from the semiconductor body 1 of the MOSFET. To accomplish this, a thin insulating layer 3 is used, which comprises silicon nitride material $Si_3N_4$. The thyristor may be secured on the insulating layer 3 by a thin adhesive layer 4. The layers 3 and 4 are relatively thin, for example 0.5 $\mu$m and 5 to 10 $\mu$m, respectively, as a result the thyristor is in good thermal contact with the MOSFET 1.

When current flows through the MOSFET by application of voltage between the source S electrodes and the drain electrode D, the semiconductor body 1 of the MOSFET generates heat and with it the thyristor 5 is elevated in temperature. In this situation, the gate source voltage of the MOSFET constitutes the anode-cathode voltage for the thyristor. If the temperature in the interior of the MOSFET rises due to an overload condition or a high ambient temperature, the temperature of the lateral thyristor 5 also rises. Hence the off-state current of the thyristor rises until it fires. This firing forms a low-impedance current path between anode A and cathode K, so that the voltage between source terminal S and gate terminal G of the MOSFET practically collapses. The forward voltage of the thyristor must, in the on-state, be lower than the threshold voltage $U_T$ of the MOSFET. The gate-source capacitance $C_{GS}$ of the MOSFET will then be discharged and the latter is blocked.

The temperature at which the thyristor fires may, for predetermined dimensions and dopings, be adjusted, for example, by a shunt 12 between the cathode-side emitter zone 8 and the cathode-side base zone 7. A typical thyristor may have, for example, the following doping values:

| | |
|---|---|
| Zones 8, 9: | $10^{19}$ to $10^{20}$ atoms As cm$^{-3}$ |
| Zone 7: | $10^{17}$ to $10^{18}$ atoms B cm$^{-3}$ |
| Zone 6: | $10^{14}$ to $10^{16}$ atoms P cm$^3$ |

Figure 2:
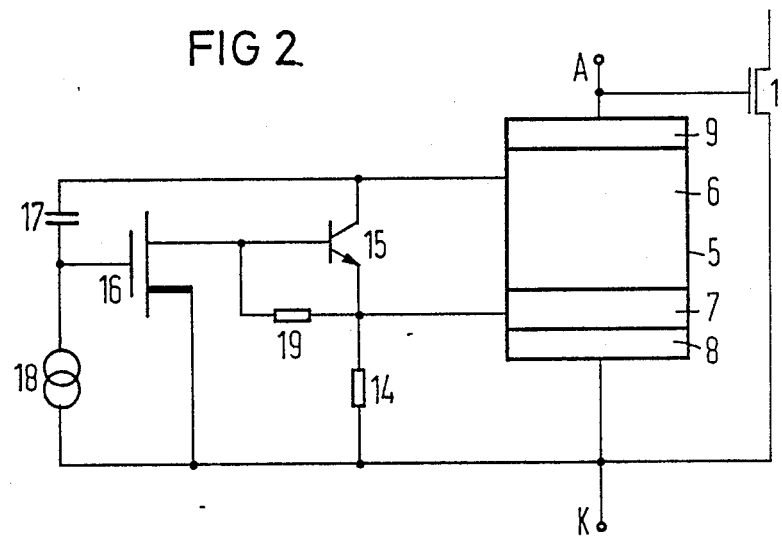
FIG. 2, depicts another illustrative embodiment of the invention preferably for realization in an integrated circuit arrangement for the semiconductor switch with improved properties as compared with the arrangement according to FIG. 1

If the semiconductor component is used in circuits with high dv/dt or voltage transition loads, it may occur that the thyristor will be fired just due to these conditions, without a temperature critical for the MOSFET having been reached. This behavior of the thyristor due to the dv/dt condition can be improved in a conventional manner which entails enlarging an electrode to act as shunt 12. But this technique also produces a reduction in the sensitivity of the thyristor to rising temperatures. It is advisable, therefore, to select for the semiconductor switch an arrangement which is illustrated in FIG. 2. It provides insensitivity to high dv/dt loads with a good temperature sensitivity.

The thyristor 5 used in FIG. 1 is shown schematically in FIG. 2. Identical or equivalent components of FIG. 2 which correspond to those of FIG. 1 are marked with the same reference numerals. To increase the dv/dt stability, arranged in shunt between zones 7 and 8 is a resistor 14 which is electrically equivalent to the shunt 12 of FIG. 1. Between zones 6 and 7, the base-collector path of a transistor 15 is connected. The base terminal of transistor 15 is connected to the cathode terminal K of the transistor via the drain-source path of a MOSFET 16 which is of the enhancement type. The gate terminal of MOSFET 16 is connected, on the one hand, via a capacitor 17 to the anode-side inner zone 6 of the transistor, and on the other hand, via a current source 18 to the cathode terminal K of the thyristor. Between the base terminal of the photo transistor 15 and its emitter terminal there may be an additional resistor 19, which serves to increase the emitter-collector off-state voltage.

With the thyristor connected through its two terminals A, K to the gate-source voltage of FET 1, a constant current will flow to the cathode terminal of the thyristor through the zones 9 and 6, the capacitor 17 and the current source 18. This current is not sufficient to turn the MOSFET 16 on. FET 1 is illustrated to demonstrate its mechanical and physical arrangement with respect to device 4 in FIG. 1 for thermal coupling purposes. FIG. 2, on the other hand, provides the electrical interconnection in a schematic diagram.

When the temperature of the MOSFET rises also the temperature of thyristor 5 and of transistor 15 increases, as well as that of the other parts of the preferably integrated circuit. But the thyristor 5 cannot turn on automatically, as the resistor 14 constitutes a strong shunt. The current of transistor 15, on the other hand, increases sharply with rising temperature, so that now current flows from anode A and zones 9 and 6 through the collector-emitter path of transistor 15 and zones 7 and 8 to the cathode K. When a temperature critical for the MOSFET 1 is reached, this current is sufficient to fire thyristor 5; it is turned on and shortcircuits the gate-source capacitance $C_{GS}$ of MOSFET 1.

But at a temperature uncritical for MOSFET 1 a steep voltage drop occurs between the terminals A and K, a sharply increasing current will flow through capacitor 17 into the gate terminal of MOSFET 16, since the current through the current source 18 remains constant. Then, MOSFET 16 is turned on and conducts the base current of the photo transistor 15 away. The latter, therefore, can be controlled to become non-conducting and thyristor 5 remains blocked.

The entire arrangement according to FIG. 2 may be constructed in integrated form on a chip of an area 1×1 to 1×2 mm. Concerning further details of the construction of an integrated circuit according to FIG. 2, reference is made to German Patent Document DE-OS 33 44 435, which the integrated circuit is described for another purpose of use.

For the thyristor it applies here also that, as previously mentioned in connection with FIG. 1, its forward on-state voltage must be lower than the threshold voltage $U_T$ of the MOSFET. For MOSFETS with high threshold voltages on the order of several volts, it may be sufficient to use as the semiconductor switch a bipolar transistor instead of the thyristor.

There has thus been shown and described novel temperature protected semiconductor device arrangements which fulfill all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

What is claimed is:

1. An electronic component including a MOSFET having a first semiconductor body having two major surfaces, a gate electrode, a source electrode, and a threshold voltage for turning the MOSFET on, the electronic component comprising:
    (a) a semiconductor switch having a second semiconductor body fastened on one of the major surfaces of the first semiconductor body and the semiconductor switch turns on when a predetermined junction temperature is reached, the semiconductor switch having a forward on-state voltage drop lower than the threshold voltage of the MOSFET;
    (b) the first and second semiconductor bodies are connected together thermally;
    (c) two electrodes are disposed on the second semiconductor body of the semiconductor switch; and
    (d) one of the two electrodes is coupled to the gate electrode while the other of the two electrodes is connected to the source electrode.

2. An electronic component according to claim 1, wherein the first and second semiconductor bodies are electrically insulated from each other.

3. An electronic component according to claim 1, wherein the semiconductor switch is in the form of a lateral thyristor.

4. An electronic component according to claim 1, characterized in that the semiconductor switch is a thyristor comprising at least two inner zones and two outer zones, and at least a shunt between one of its inner zones and the outer zone contiguous thereto.

5. An electronic component according to claim 4, further comprising:
    a transistor having an emitter-collector path connected to the inner zones of the thyristor and a base terminal; and
    the base terminal of the transistor is connected via the source-drain path of said MOSFET to a cathode terminal of the thyristor, the MOSFET is an enhancement type, the gate terminal of the MOSFET is connected via a capacitor to the inner zone contiguous to the outer connected to an anode terminal which is one of the two terminals, and a current source having first and second terminals, the first terminal is connected to the gate terminal of the MOSFET while the second terminal is connected to a cathode terminal which is the other one of the two terminals of the second semiconductor body.

6. An electronic component according to claim 1, wherein the semiconductor switch is a bipolar transistor.

7. An electronic component according to claim 2, wherein the semiconductor switch is a bipolar transistor.

* * * * *